United States Patent
Ohki

(10) Patent No.: US 8,030,686 B2
(45) Date of Patent: Oct. 4, 2011

(54) SEMICONDUCTOR DEVICE AND METHOD FOR MANUFACTURING THE SAME

(75) Inventor: Toshihiro Ohki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 375 days.

(21) Appl. No.: 12/362,306

(22) Filed: Jan. 29, 2009

(65) Prior Publication Data

US 2009/0189205 A1      Jul. 30, 2009

(30) Foreign Application Priority Data

Jan. 30, 2008   (JP) .................. 2008-018502

(51) Int. Cl.
   *H01L 31/072* (2006.01)
(52) U.S. Cl. ............... 257/192; 257/194; 257/E29.246; 257/E21.403
(58) Field of Classification Search .............. 257/192, 257/194, E29.246, E21.403; 438/167, 172, 438/483
See application file for complete search history.

(56) References Cited

U.S. PATENT DOCUMENTS 6,404,004 B1 *  6/2002  Arimochi et al. ............ 257/306
6,924,218 B2 *  8/2005  Marsh et al. ................. 438/570

FOREIGN PATENT DOCUMENTS

JP     2002-359256 A     12/2002

* cited by examiner

*Primary Examiner* — David Vu
(74) *Attorney, Agent, or Firm* — Westerman, Hattori, Daniels & Adrian, LLP

(57) ABSTRACT

A semiconductor device having a source electrode and a drain electrode formed over a semiconductor substrate, a gate electrode formed over the semiconductor substrate and disposed between the source electrode and the drain electrode, a protection film made of an insulating material and formed between the source electrode and the gate electrode and between the drain electrode and the gate electrode, and a gate side opening formed at least in one of a portion of the protection film between the source electrode and the gate electrode and a portion of the protection film between the drain electrode and the gate electrode and disposed away from all of the gate electrode, the source electrode and the drain electrode.

8 Claims, 12 Drawing Sheets

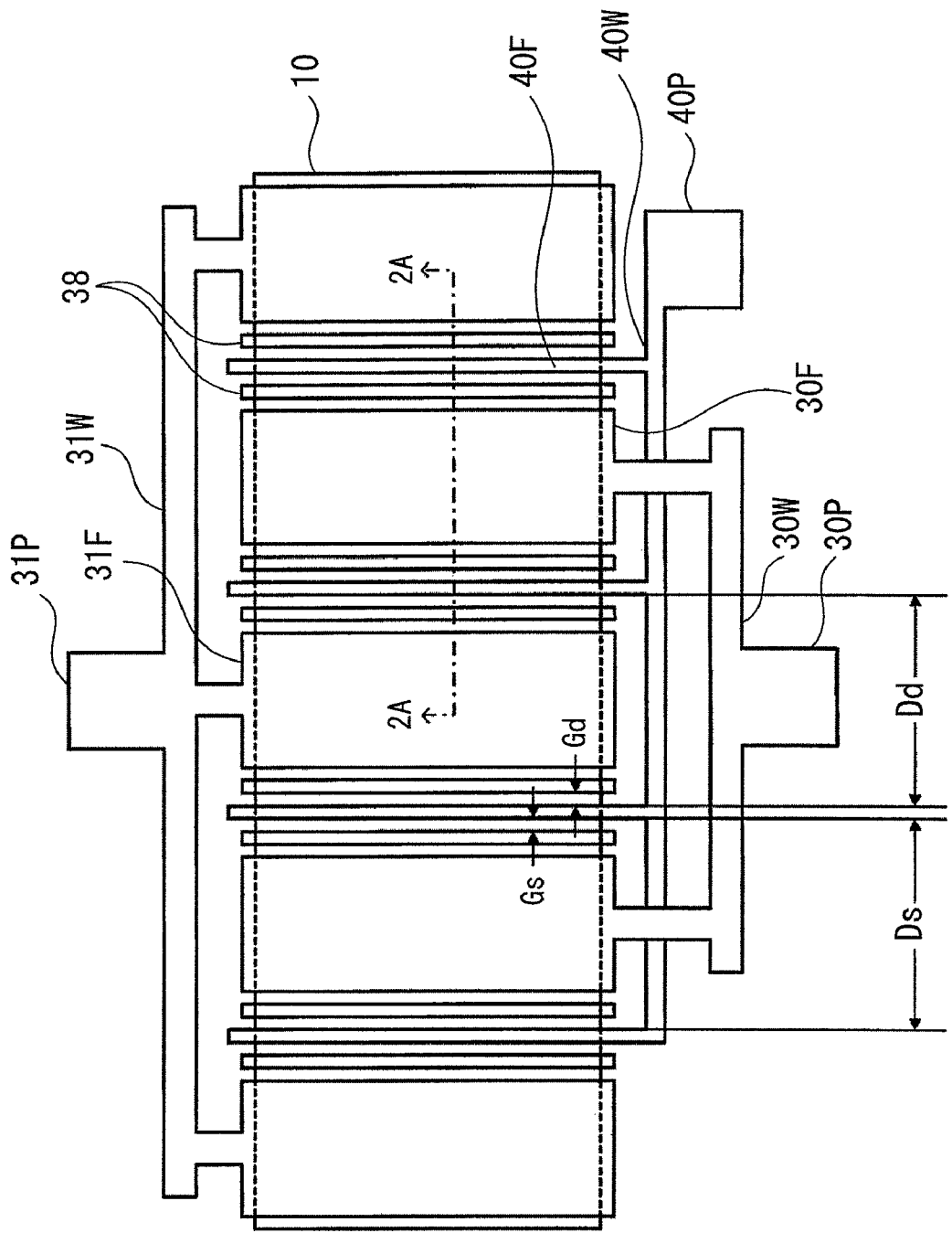

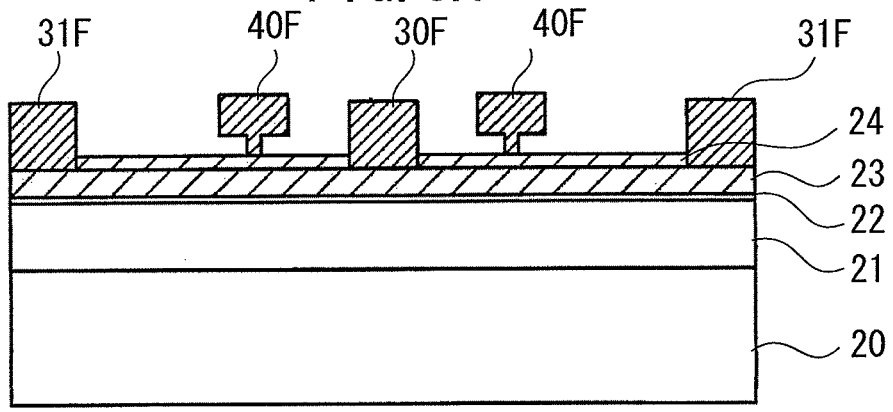
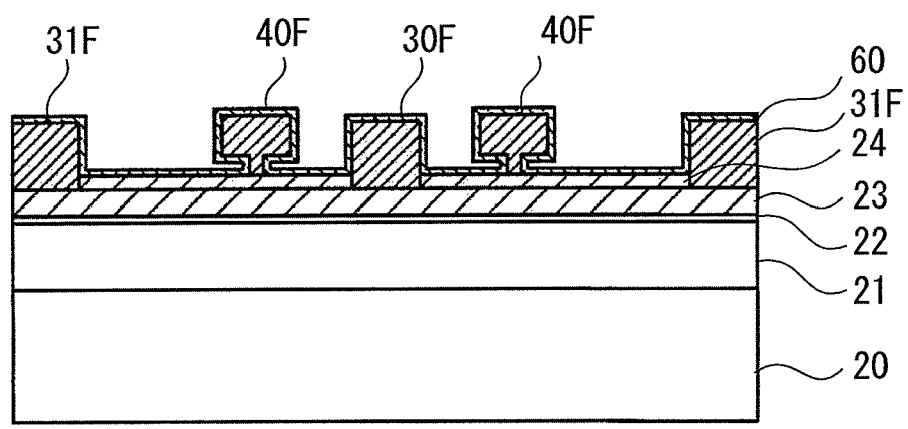
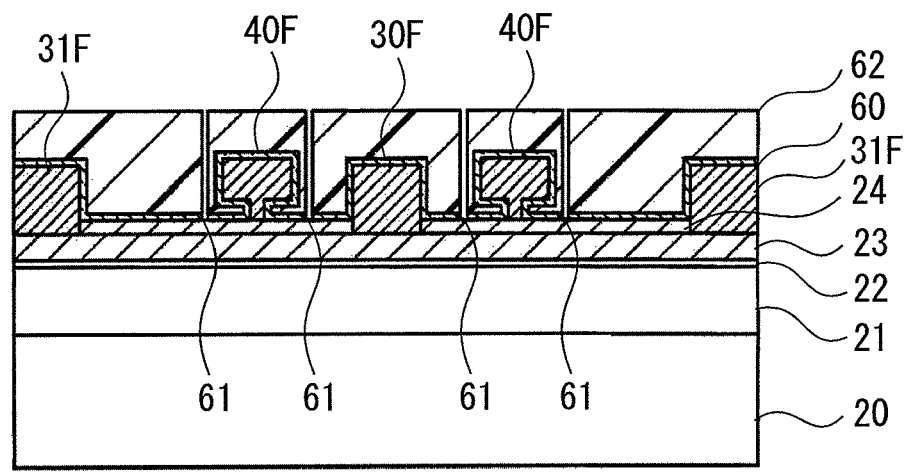

RELATED ART

US 8,030,686 B2

SEMICONDUCTOR DEVICE AND METHOD FOR MANUFACTURING THE SAME

CROSS-REFERENCE TO RELATED APPLICATIONS

This application is based upon and claims the benefit of priority from prior Japanese Patent Application No. 2008-018502, filed on Jan. 30, 2008, the entire contents of which are incorporated herein by reference.

BACKGROUND OF THE INVENTION

1. Field

The present invention relates to a semiconductor device and a method for manufacturing the semiconductor device.

2. Description of the Related Art

Nitride semiconductors typified by GaN, AlN, InN and their mixed crystals are drawing attention as materials for high-power devices and short-wavelength light-emitting devices because of their excellent material characteristics. As a high-power device, a high electron mobility transistor (HEMT) made of a nitride semiconductor has been disclosed in JP-A-2002-359256.

For example, as illustrated in FIG. 7, the gate electrode 40 of an HEMT made of a conventional nitride semiconductor is formed by forming a gate opening in a protection film 35 covering the semiconductor surface between the source electrode 31 and the drain electrode 30 thereof and by filling the lower end of the gate electrode 40 into this gate opening. At this time, the protection film 35 makes contact with the side faces of the lower end of the gate electrode.

After forming the gate electrode, usually, heat treatment is performed to reform the material of the gate electrode, and ultraviolet light irradiation and plasma treatment are performed to densify the protection film. After these treatments, the protection film 35 shrinks and a clearance 90 is formed between the protection film 35 and each of the side faces of the lower end of the gate electrode 40, whereby the semiconductor surface is exposed.

When the HEMT operates, electric field concentration occurs at the lower end of the gate electrode and at the drain-side fringe of the gate electrode, whereby electrons are trapped on the semiconductor surface exposed in this region. The trapped electrons may cause current collapse.

SUMMARY

According to an aspect of the invention, a semiconductor device includes a source electrode and a drain electrode formed over a semiconductor substrate, a gate electrode formed over the semiconductor substrate and disposed between the source electrode and the drain electrode, a protection film made of an insulating material and formed between the source electrode and the gate electrode and between the drain electrode and the gate electrode, and a gate side opening formed at least in one of a portion of the protection film between the source electrode and the gate electrode and a portion of the protection film between the drain electrode and the gate electrode and disposed away from all of the gate electrode, the source electrode and the drain electrode.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 1 is a plan view showing a semiconductor device according to a first embodiment;

FIGS. 5A to 5D are sectional views showing a semiconductor device at the manufacturing steps of a method for manufacturing the semiconductor device according to a fourth embodiment.

DESCRIPTION OF THE PREFERRED EMBODIMENTS

FIG. 1 is a plan view showing a semiconductor device according to a first embodiment. An active region 10 is defined on the surface of a semiconductor substrate. The active region 10 shown in FIG. 1 is a rectangle being long in the lateral direction.

Drain electrodes (drain fingers) 31F and source electrodes (source fingers) 30F are disposed alternately in the longitudinal direction of the active region 10. FIG. 1 shows three drain electrodes 31F and two source electrodes 30F. Each of the source electrodes 30F and the drain electrodes 31F is disposed so as to cross the active region 10 in the extension direction of the source electrodes 30F and the drain electrodes 31F.

The source electrodes 30F are mutually connected via a source wire 30W outside the active region 10. A source pad 30P is connected to the source wire 30W. The drain electrodes 31F are mutually connected via a drain wire 31W outside the active region 10. A drain pad 31P is connected to the drain wire 31W.

A gate electrode (gate finger) 40F is disposed between the source electrode 30F and the drain electrode 31F adjacent to each other, spaced from both the electrodes. Each of the gate electrodes 40F is disposed so as to cross the active region 10 in the extension direction of the gate electrodes 40F. The gate electrodes 40F are mutually connected via a gate wire 40W outside the active region 10. A gate pad 40P is connected to the gate wire 40W. The gate wire 40W intersects with the source wire 30W. At this intersection, the wires are insulated from each other.

A gate side opening 38 is disposed between the gate electrode 40F and the source electrode 30F, and another gate side opening 38 is disposed between the gate electrode 40F and the drain electrode 31F. Each of the gate side openings 38 is disposed so as to cross the active region 10 in the extension direction of the gate side openings 38.

A method for manufacturing the semiconductor device according to the first embodiment will be described below referring to FIGS. 2A to 2F. FIGS. 2A to 2F are sectional views taken on dashed-dotted line 2A-2A of FIG. 1.

Figure 2A:
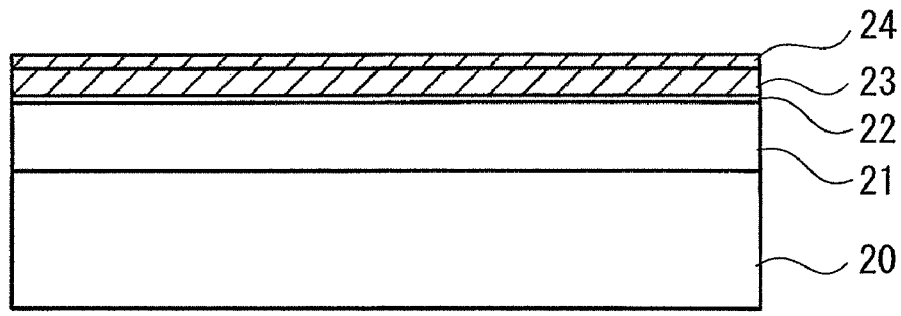
FIGS. 2A to 2E are sectional views showing a semiconductor device at the manufacturing steps of a method for manufacturing the semiconductor device according to the first embodiment.

As shown in FIG. 2A, a carrier transport layer 21 made of undoped GaN, a spacer layer 22 made of undoped AlGaN, a carrier supply layer 23 made of n-type AlGaN and a cap layer 24 made of n-type GaN are laminated in this order on a semiconductor substrate 20 made of SiC by MOVPE (Metal Organic Vapor Phase Epitaxy).

The thickness of the carrier transport layer 21 is 3 µm, for example, and the thickness of the spacer layer 22 is 5 nm, for example. The thickness of the carrier supply layer 23 is 30 nm, for example. The n-type impurity doped in the carrier supply layer 23 is Si, and the concentration of the doping is approximately $5 \times 10^{18}$ cm$^{-3}$. The thickness of the cap layer 24 is 10 nm, for example. The n-type impurity doped in the cap layer 24 is Si, and the concentration of the doping is approximately $5 \times 10^{18}$ cm$^{-3}$.

Element isolation is performed by etching the respective layers of the cap layer 24 to the carrier transport layer 21 in regions other than the active region. This defines the active region 10 shown in FIG. 1. In other words, as shown in FIG. 1, the respective layers of the cap layer 24 to the carrier transport layer 21 are not disposed in the regions other than the active region 10. Element isolation may also be performed by increasing the resistances of these layers by ion implantation or the like instead of etching.

Figure 2B:
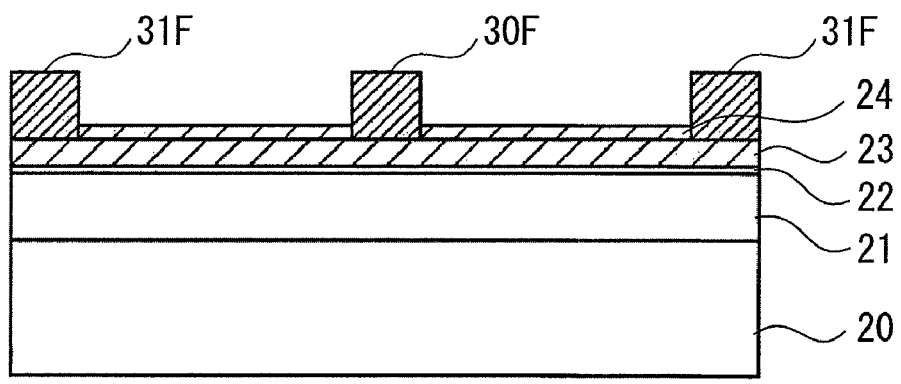

As shown in FIG. 2B, openings are formed in the cap layer 24 so as to match the planar shapes of the source electrode and the drain electrode using the photolithography technology. Dry etching using chlorine gas can be applied to the etching for the cap layer 24. The cap layer 24 may be left thinly on the bottom face of the opening. Conversely, the surface layer portion of the carrier supply layer 23 may be etched thinly. At this time, a resist pattern used as an etching mask remains on the cap layer 24.

A Ti film and an Al film are deposited in this order over the entire surface. Then, the resist pattern is removed together with the Ti film and the Al film laminated thereon. Hence, the source electrode 30F and the drain electrode 31F having a two-layer structure of the Ti film and the Al film are formed. The ohmic feature between the source electrode 30F and the carrier transport layer 21 and the ohmic feature between the drain electrode 31F and the carrier transport layer 21 are obtained by performing heat treatment at a temperature in the range of 400° C. to 1000° C., for example, 600° C., in a nitrogen atmosphere. At this time, the source wire 30W is not yet formed at the intersection of the source wire 30W and the gate wire 40W and is in a disconnected state.

Figure 2C:
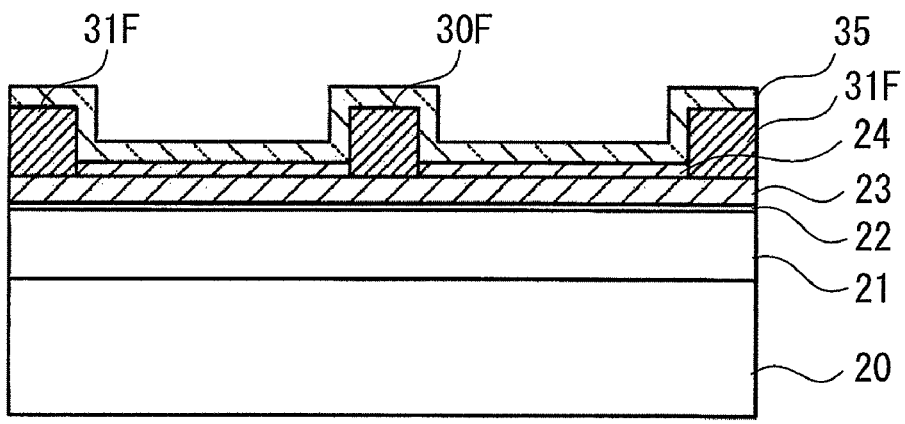

As shown in FIG. 2C, a protection film 35 made of SiN is formed by, for example, CVD (Chemical Vapor Deposition) or sputtering so as to cover the cap layer 24, the source electrodes 30F and the drain electrodes 31F. It is assumed that the thickness of the protection film 35 is in the range of 5 nm to 500 nm, for example, 100 nm.

Figure 2D:
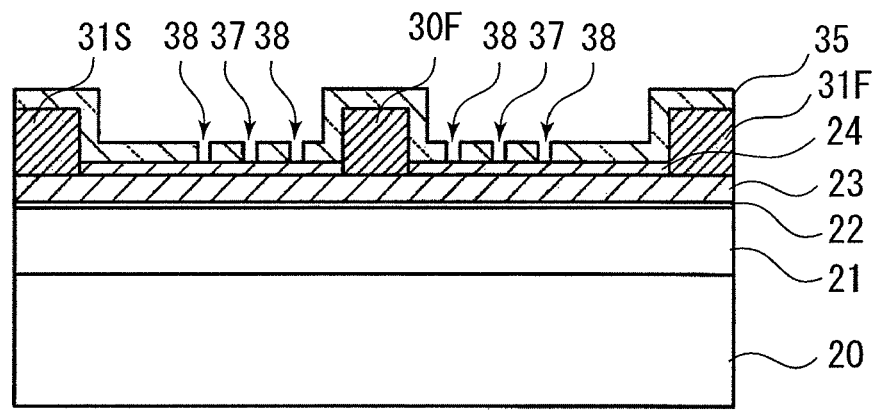

As shown in FIG. 2D, gate openings 37 and gate side openings 38 are formed in the protection film 35. Dry etching using fluorine gas is applied to the etching of the protection film 35. The planar shape of the gate opening 37 is matched with the shape of the gate electrode 40F shown in FIG. 1.

Figure 2E:
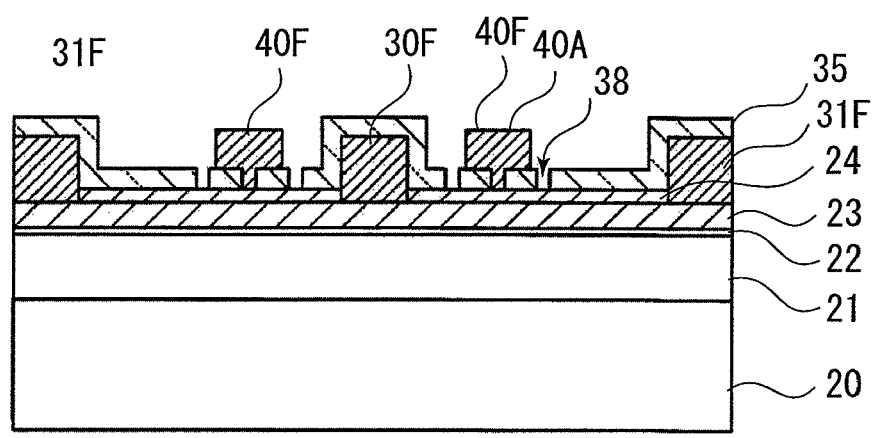

As shown in FIG. 2E, the gate electrode 40F, T-shaped in cross section, is formed. At this time, the gate wire 40W and the gate pad 40P are also formed simultaneously. The lift-off method using a two-layer resist pattern can be applied to the formation of the gate electrode 40F. The gate electrode 40F has a two-layer structure of a Ni film and an Au film. A portion of the lower side of the gate electrode 40F is completely filled into the gate opening 37. The upper portion of the gate electrode 40F extends in an eave shape toward the source electrode 30F and the drain electrode 31F. The tip ends of the eave portions 40A of the gate electrode 40F do not reach the gate side openings 38.

The width of the gate opening 37 (the opening length of the gate) is approximately 0.1 µm to 1 µm, and the width of the upper portion of the gate electrode 40F (the lengthwise dimension of the gate) is 0.3 µm to 3 µm.

After the gate electrodes 40F were formed, heat treatment is performed at a temperature of approximately 400° C. in a nitrogen atmosphere to densify the protection film 35 and to improve the protection function thereof. Ultraviolet light irradiation may also be performed instead of heat treatment.

Figure 2F:
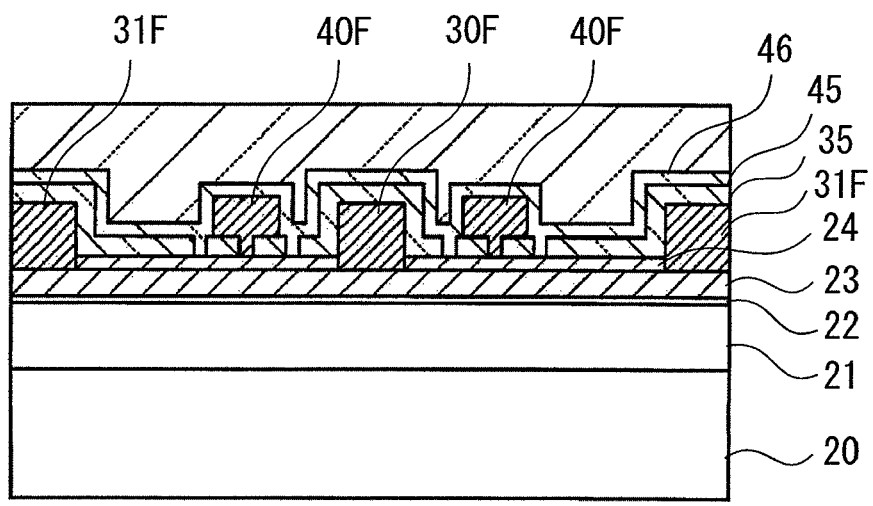
FIG. 2F is a sectional view showing the semiconductor device according to the first embodiment.

As shown in FIG. 2F, a protection film 45 made of SiN covers the entire face of the substrate, and an interlayer insulation film 46 is formed thereon. Then, the source wire 30W disconnected at the intersection of the source wire 30W and the gate wire 40W shown in FIG. 1 is connected using a wire on the interlayer insulation film 46.

Since the linear expansion coefficient of the protection film 35 is larger than that of the semiconductor substrate 20, when heat treatment is performed to densify the protection film 35 in the state shown in FIG. 2E, the protection film 35 shrinks relatively significantly. In the case that the gate side opening 38 is not provided, a clearance is apt to be formed between the protection film 35 and each of the side faces of the lower portion of the gate electrode 40F filled into the gate opening 37. An electron trap level is formed on the semiconductor surface exposed inside the clearance. Trapped electrons may cause current collapse.

Since the gate side opening 38 is formed in the first embodiment, even if the portion of the protection film 35 covering the source electrode 30F shrinks, the shrinkage does not directly affect the portion making contact with the gate electrode 40F. Since the distance between the gate electrode 40F and the gate side opening 38 is shorter than the distance between the gate electrodes 40F adjacent to each other, the effect of the shrinkage of the protection film 35 disposed between the gate electrode 40F and the gate side opening 38 is small. For this reason, a clearance is hardly formed between the gate electrode 40F and the protection film 35, and current collapse due to electron trapping can be suppressed.

Since the upper protection film 45 is made of SiN, the same material as that of the lower protection film 35, and is filled into the gate side opening 38, after the upper protection film 45 was formed, SiN is disposed continuously from one gate electrode 40F to another gate electrode 40F adjacent thereto. However, after the upper protection film 45 is formed, high-temperature heat treatment causing the shrinkage problem of the SiN film is not performed. Hence, even if the SiN film is disposed continuously from one gate electrode 40F to another gate electrode 40F adjacent thereto, the effect of suppressing the occurrence of clearances on both sides of the lower end of the gate electrode 40F is not reduced.

Although the gate side opening 38 is disposed on both sides of the gate electrode 40F in the first embodiment, the gate side opening 38 may also be disposed only between the gate electrode 40F and the source electrode 30F or between the gate electrode 40F and the drain electrode 31F. The potential difference between the gate and the drain is usually larger than that between the gate and the source. Hence, electric field concentration occurs at the lower end of the gate electrode 40F and near the drain-side fringe of the gate electrode 40F. Because of this electric field concentration, electrons are trapped on the semiconductor surface. In order to suppress the electron trapping, it is preferable that the gate side opening 38 should be disposed between the gate electrode 40F and the drain electrode 31F.

If the gate side opening 38 is disposed too close to the side face of the lower portion of the gate electrode 40F, the effect of the electric field concentrated at the lower end and near the drain-side fringe of the gate electrode 40F extends to the semiconductor surface constituting the bottom face of the gate side opening 38. If electrons are trapped on the semiconductor surface, current collapse occurs. In order to prevent current collapse, it is preferable that the distance from the lower end of the gate electrode 40F to the gate side opening 38 should be lengthened, for example to 0.1 μm or more, to the extent that the semiconductor surface is not affected by the electric field.

Conversely, if the gate side opening 38 is disposed too distant from the gate electrode 40F, the effect of providing the gate side opening 38 is not obtained. In order to obtain the effect of providing the gate side opening 38, it is preferable that the distance between the lower end of the gate electrode 40F and the gate side opening 38 should be one-tenth or less of the distance between the lower portion of the gate electrode 40F and the lower portion of the gate electrode 40F disposed adjacent thereto on the side of the gate side opening 38.

For example, in FIG. 1, it is preferable that the distance Gd between the gate electrode 40F and the gate side opening 38 disposed on the drain side should be one-tenth or less of the distance Dd between the lower portion of the gate electrode 40F and the lower portion of the gate electrode 40F disposed adjacent thereto via the drain electrode 31F. In addition, it is preferable that the distance Gs between the gate electrode 40F and the gate side opening 38 disposed on the source side should be one-tenth or less of the distance Ds between the lower end of the gate electrode 40F and the lower end of the gate electrode 40F disposed adjacent thereto via the source electrode 30F.

Next, a method for manufacturing a semiconductor device according to a second embodiment will be described below referring to FIGS. 3A to 3E.

The method for manufacturing the semiconductor device according to the first embodiment up to the steps shown in FIGS. 2A to 2C are common to the corresponding steps of the method for manufacturing the semiconductor device according to the second embodiment.

Figure 3A:
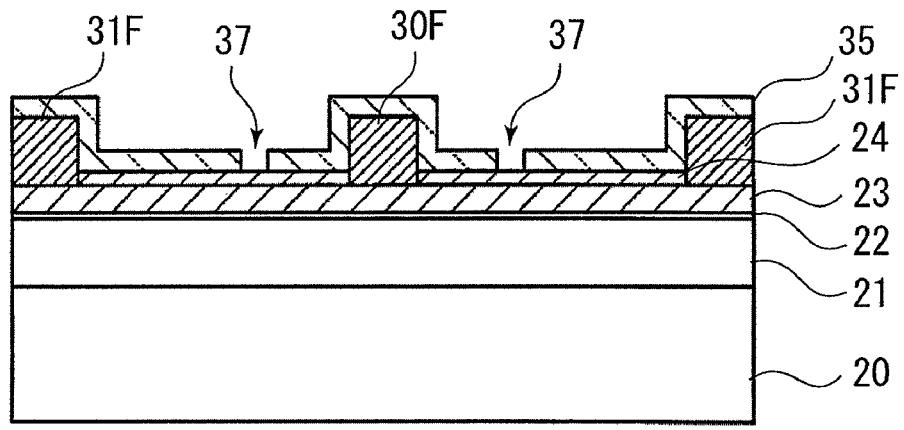
FIGS. 3A to 3D are sectional views showing a semiconductor device at the manufacturing steps of a method for manufacturing the semiconductor device according to a second embodiment.

As shown in FIG. 3A, the gate opening 37 is formed in the protection film 35. Although the gate opening 37 and the gate side opening 38 are formed simultaneously as shown in FIG. 2D in the first embodiment, the gate side opening 38 is not formed at this stage in the second embodiment. The width of the gate opening 37 can be slightly larger than the width of gate opening 37 formed using the method according to the first embodiment in consideration of the film thickness of the insulation film 50 that is formed later.

Figure 3B:
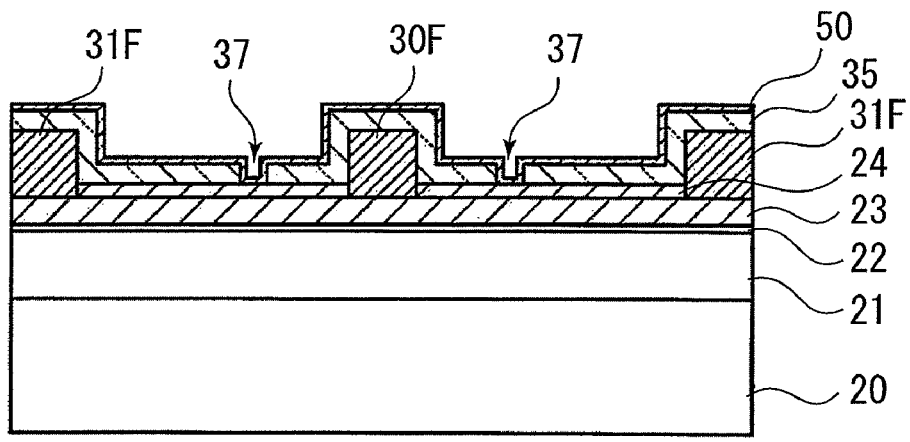

As shown in FIG. 3B, the insulation film 50 made of $Al_2O_3$ is formed on the protection film 35 so as to cover the inner face of the gate openings 37 by CVD, sputtering or the like. The thickness of the insulation film 50 is in the range of 1 nm to 100 nm, for example, 10 nm, and a concave portion reflecting the shape of the inner face of the gate opening 37 is formed thereon. The insulation film 50 is used as a gate insulation film for a transistor having the Metal Insulator Semiconductor (MIS) structure.

Figure 3C:
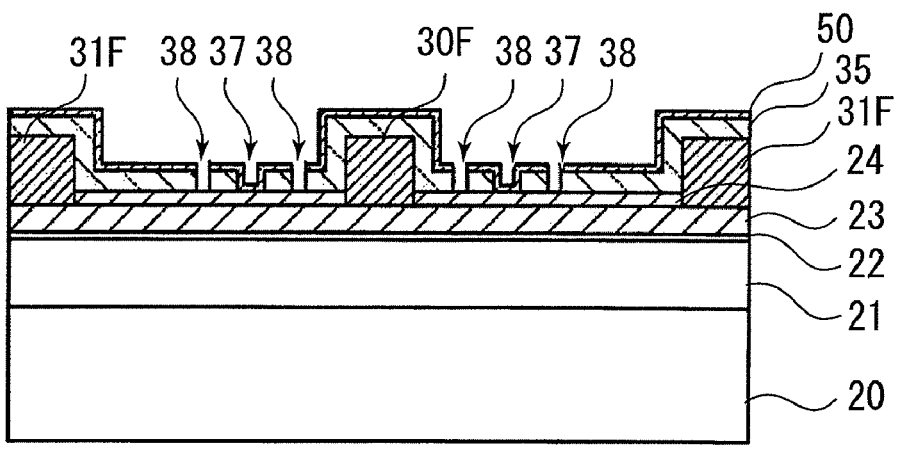

As shown in FIG. 3C, the gate side opening 38 is formed on both sides of the gate opening 37. At the gate side opening 38, the cap layer 24 is exposed via the insulation film 50 and the protection film 35.

Figure 3D:
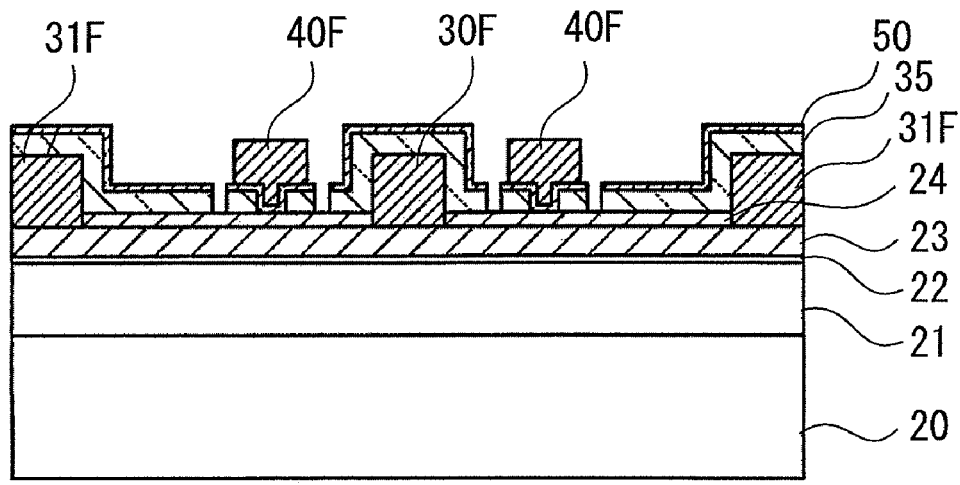

As shown in FIG. 3D, the gate electrode 40F is formed. The method for forming the gate electrode 40F is the same as the method for forming the gate electrode 40F in the method for manufacturing the semiconductor device according to the first embodiment shown in FIG. 2E. After the gate electrode 40F is formed, heat treatment is performed at a temperature of approximately 400° C. in a nitrogen atmosphere to densify the protection film 35 and to improve the protection function thereof as in the case of the first embodiment.

Figure 3E:
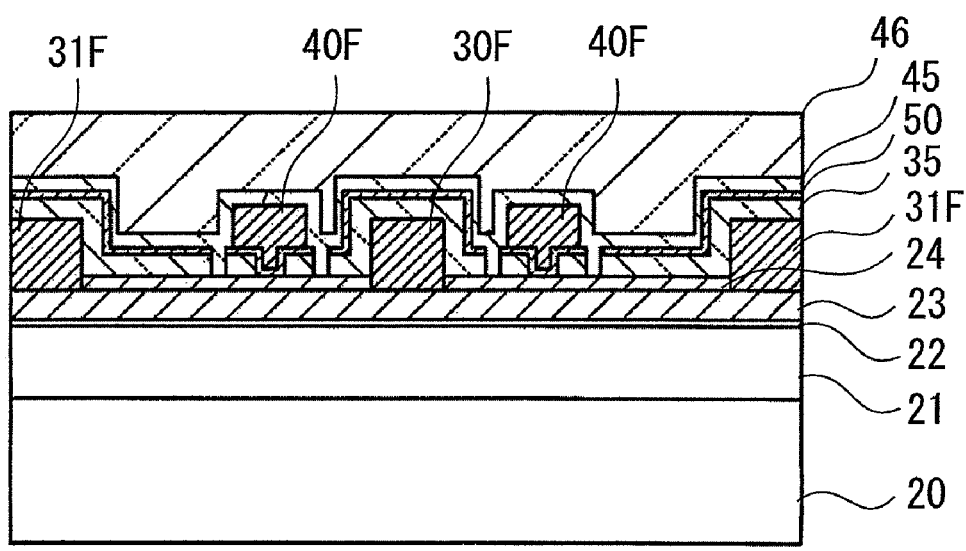
FIG. 3E is a sectional view showing the semiconductor device according to the second embodiment.

As shown in FIG. 3E, the protection film 45 is formed so as to cover the entire face of the substrate, and the interlayer insulation film 46 is formed thereon.

Also in the second embodiment, since the gate side opening 38 is formed, a clearance is hardly formed at the interface between the insulation film 50 and each of the side faces of the lower portion of the gate electrode 40F. Furthermore, it is possible to prevent a clearance from occurring at the interface between the insulation film 50 and the gate-side end face of the protection film 35. For this reason, it is possible to prevent current collapse as in the case of the first embodiment.

Also in the second embodiment, the gate side opening 38 may be disposed only on one side of the gate electrode 40F instead of being disposed on both sides thereof.

Next, a method for manufacturing a semiconductor device according to a third embodiment will be described below referring to FIGS. 4A to 4D.

Figure 4A:
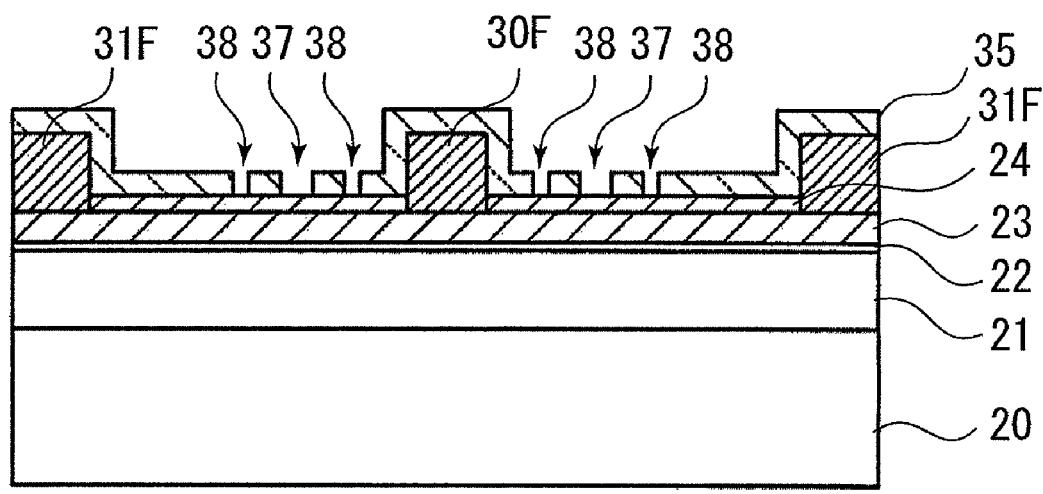
FIGS. 4A to 4C are sectional views showing a semiconductor device at the manufacturing steps of a method for manufacturing the semiconductor device according to a third embodiment.

In the second embodiment, only the gate openings 37 are formed, but the gate side openings 38 are not formed at the step shown in FIG. 3A. However, in the third embodiment, as shown in FIG. 4A, the gate side opening 38 is formed on both sides of the gate opening 37 simultaneously therewith. This method is the same as the method according to the first embodiment in that the gate opening 37 and the gate side opening 38 are formed simultaneously. However, the width of the gate opening 37 is slightly larger than that of the gate opening 37 that is formed using the method according to the first embodiment as in the case of the second embodiment.

Figure 4B:
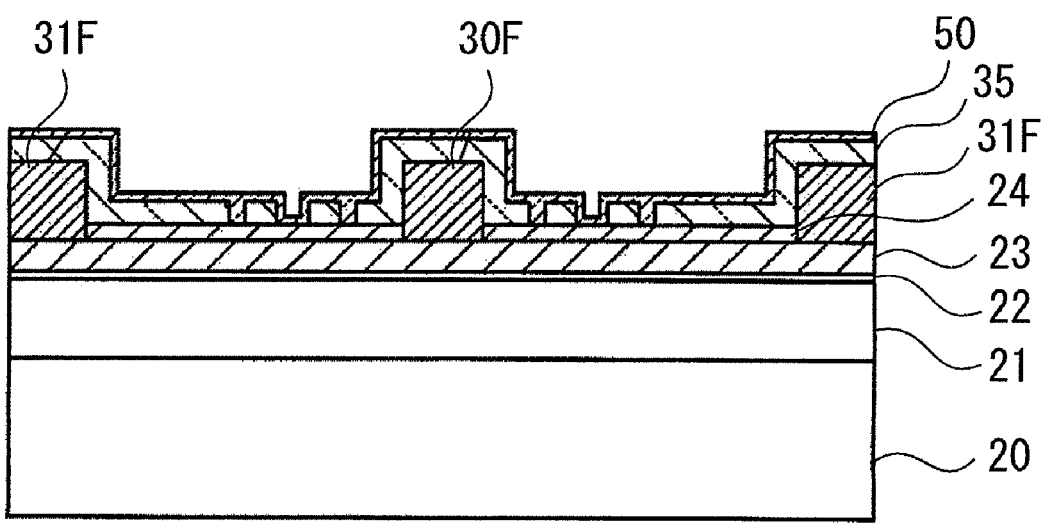

As shown in FIG. 4B, the insulation film 50 covering the inner faces of the gate openings 37 and the inner faces of the gate side openings 38 is formed on the protection film 35. A concave portion reflecting the shape of the inner face of the gate opening 37 is formed at the position of the gate opening 37 as in the case of the second embodiment. The gate side opening 38 is filled with the insulation film 50. In the case that the thickness of the insulation film 50 is sufficiently small in comparison with the width of the gate side opening 38, a concave portion reflecting the shape of the inner face thereof is also formed at the position of the gate side opening 38.

Figure 4C:
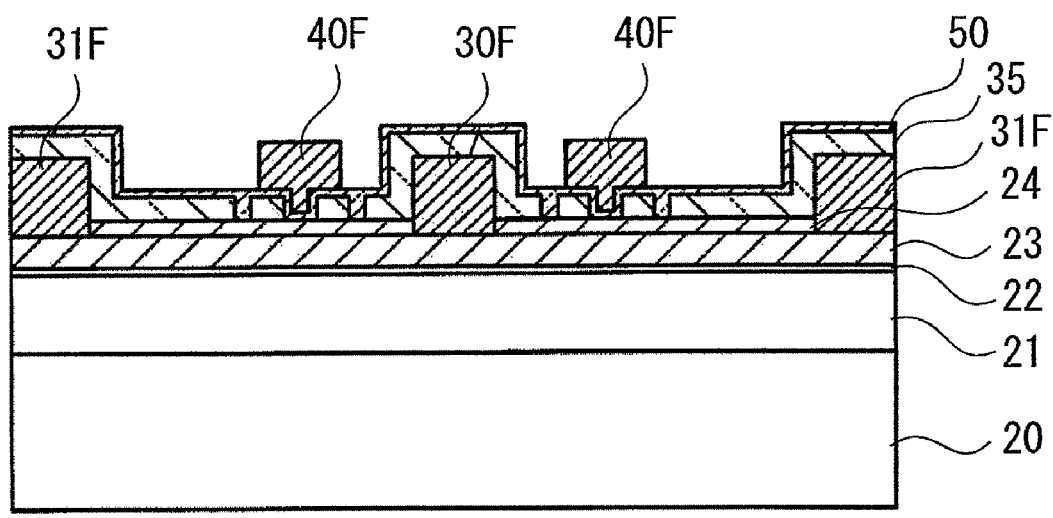
Figure 4D:
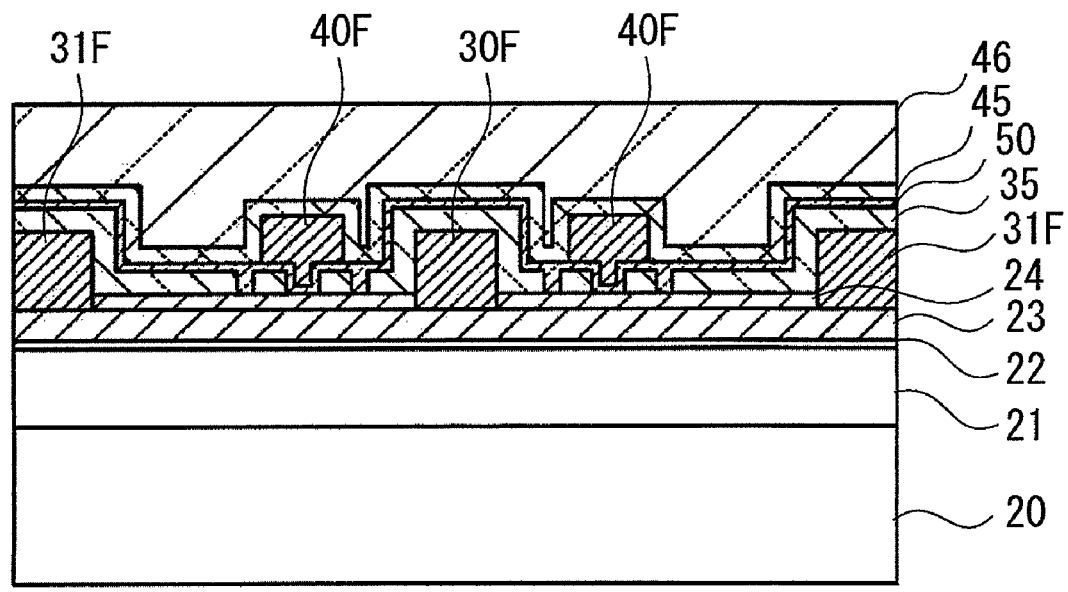
FIG. 4D is a sectional view showing the semiconductor device according to the third embodiment.

As shown in FIG. 4C, as in the case of the method according to the second embodiment, the gate electrodes 40F are formed, and then heat treatment is performed. As shown in FIG. 4D, the protection film 45 and the interlayer insulation film 46 are formed over the entire face of the substrate.

Also in the third embodiment, since the gate side opening 38 is formed in the protection film 35, a clearance is hardly formed at the interface between the insulation film 50 and the gate-side end face of the protection film 35. The gate side opening 38 is not formed in the insulation film 50 that is formed on the protection film 35. However, unlike the protection film 35, the insulation film 50 is also disposed below the gate electrodes 40F, and both side portions of the gate electrode 40F are not separated from each other. Hence, the effect of the shrinkage of the insulation film 50 is less than the effect of the shrinkage of the protection film 35.

The gate side opening 38 may also be disposed only on one side of the gate electrode 40F as in the case of the first embodiment.

Next, a method for manufacturing a semiconductor device according to a fourth embodiment will be described below referring to FIGS. 5A to 5E. The method according to the first embodiment up to the steps shown in FIGS. 2A to 2B are common to the corresponding steps of the method according to the fourth embodiment.

As shown in FIG. 5A, the gate electrode 40F, T-shaped in cross section, is formed on the cap layer 24. The gate electrode 40F can be formed using the three-layer resist method, for example.

As shown in FIG. 5B, a protection film 60 made of SiN and having a thickness of 5 nm to 500 nm, for example, is formed on the substrate so as to cover the surfaces of the gate electrodes 40F, the source electrodes 30F and the drain electrodes 31F. The protection film 60 is formed by CVD or the like suited for isotropic growth so that the film is deposited on the lower surfaces of the eave portions of the gate electrode 40F and the hidden regions of the eave portions.

As shown in FIG. 5C, after forming a resist film 62, an opening is formed between the gate electrode 40F and the source electrode 30F, and another opening is formed between the gate electrode 40F and the drain electrode 31F. Gate side openings 61 are formed by etching the protection film 60 using the resist film 62 provided with the openings as an etching mask. The gate side opening 61 may also be formed only on one side of the gate electrode 40F.

Figure 5D:
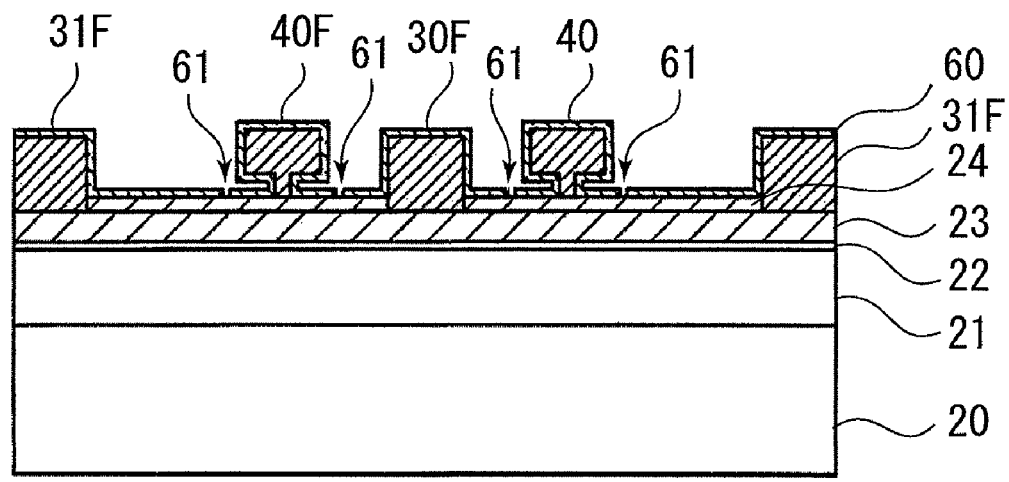
Figure 5E:
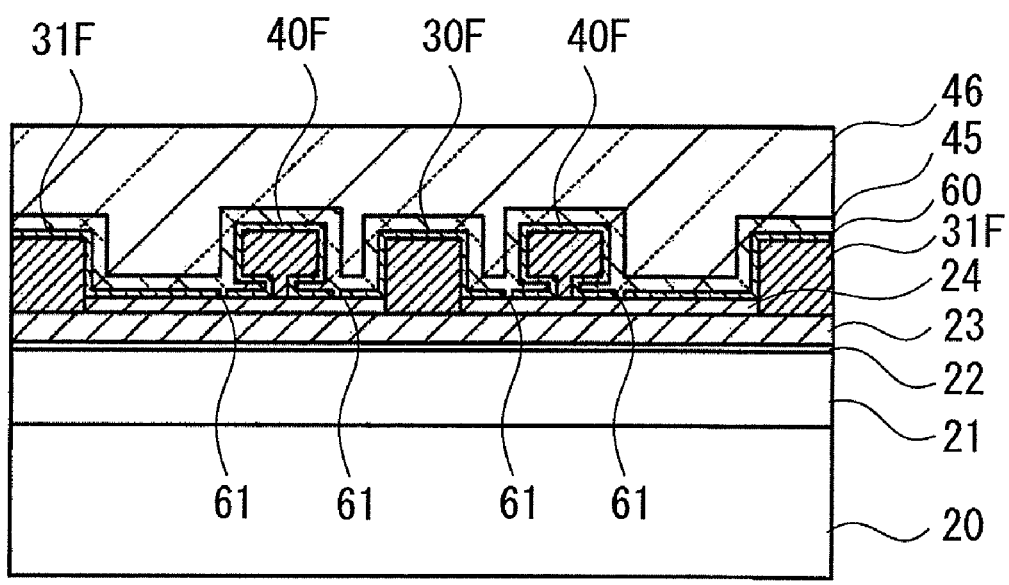
FIG. 5E is a sectional view showing the semiconductor device according to the fourth embodiment.

As shown in FIG. 5D, the resist film 62 is removed. In this state, a heat treatment is performed. This heat treatment densities the protection film 60 and improves the protection function thereof. As shown in FIG. 5E, the protection film 45 and the interlayer insulation film 46 are formed on the protection film 60. The gate side opening 61 provided in the protection film 60 is filled with the protection film 45 that is formed thereon.

In the fourth embodiment, the gate side opening 61 is formed in the protection film 60 during the heat treatment performed after the gate electrode 40F was formed. Hence, the occurrence of a clearance at the interface between the protection film 60 and each of the side faces of the lower portion of the gate electrode 40F due to the shrinkage of the protection film 60 is suppressed.

Figure 6A:
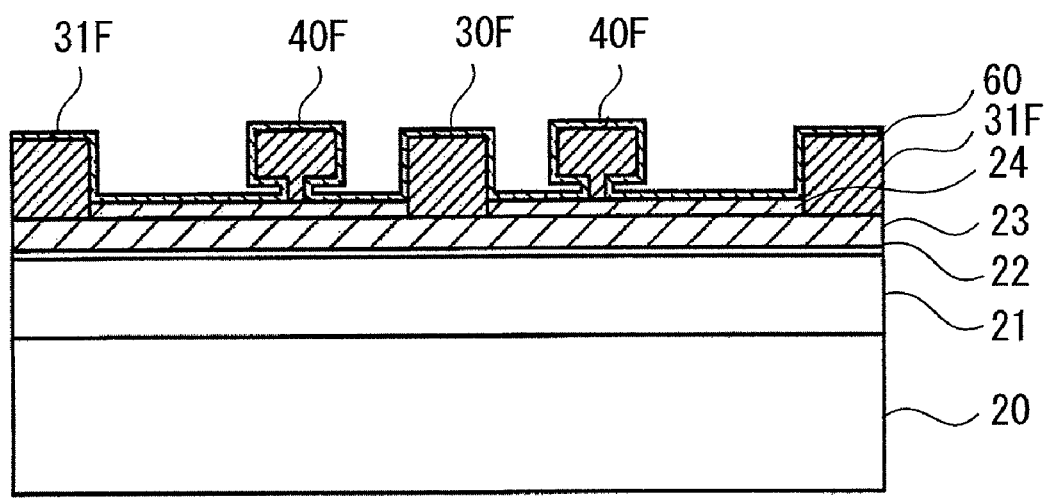
FIGS. 6A to 6C are sectional views showing a semiconductor device at the manufacturing steps of a method for manufacturing the semiconductor device according to a fifth embodiment.

Next, a method for manufacturing a semiconductor device according to a fifth embodiment will be described below referring to FIGS. 6A to 6D. The structure shown in FIG. 6A is the same as the structure of the stage shown in FIG. 5B illustrating the method according to the fourth embodiment. The surfaces of the gate electrodes 40F, the source electrodes 30F, the drain electrodes 31F and the cap layer 24 are covered with the protection film 60.

Figure 6B:
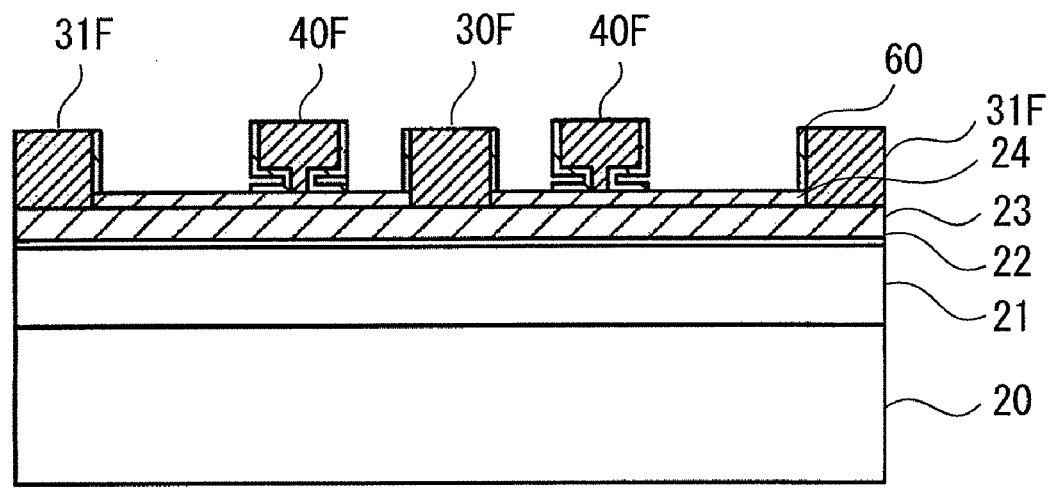

As shown in FIG. 6B, the protection film 60 on the surface of the cap layer 24 is subjected to anisotropic etching so that the protection film 60 remains in the hidden regions of the eave portions of the gate electrode 40F. The protection film 60 on the upper faces of the gate electrodes 40F, the source electrodes 30F and the drain electrodes 31F is also removed, and the upper faces of these electrodes are exposed. The protection film 60 remains on the lower surfaces of the eave portions of the gate electrodes 40F and on the side faces of the gate electrodes 40F, the source electrodes 30F and the drain electrodes 31F.

In this state, heat treatment is performed. This heat treatment densities the protection film 60 and improves the protection function thereof.

Figure 6C:
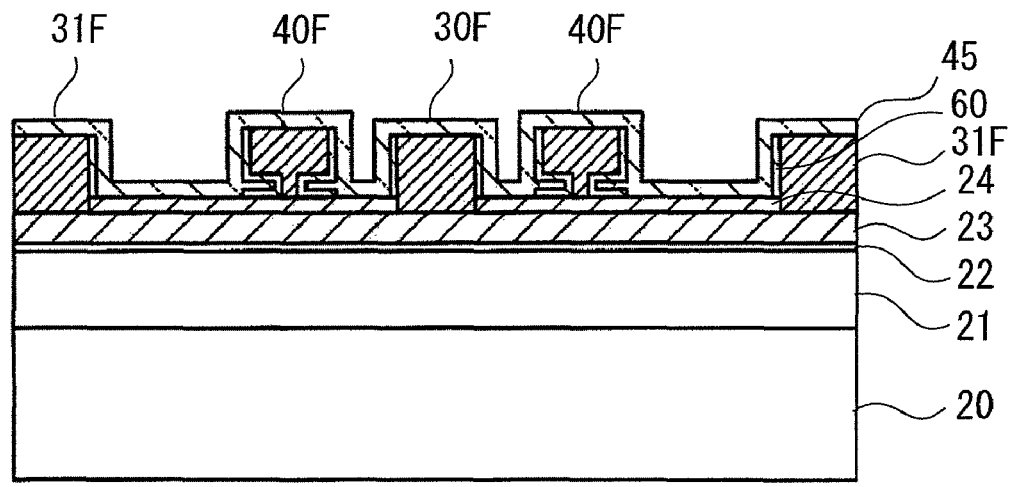
Figure 6D:
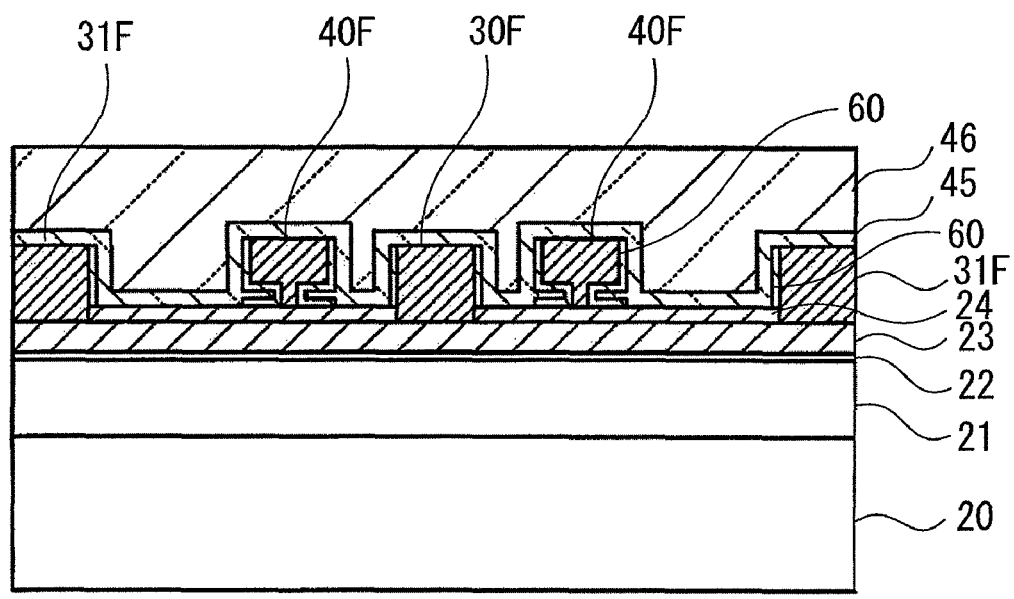
FIG. 6D is a sectional view showing the semiconductor device according to the fifth embodiment.
Figure 7:
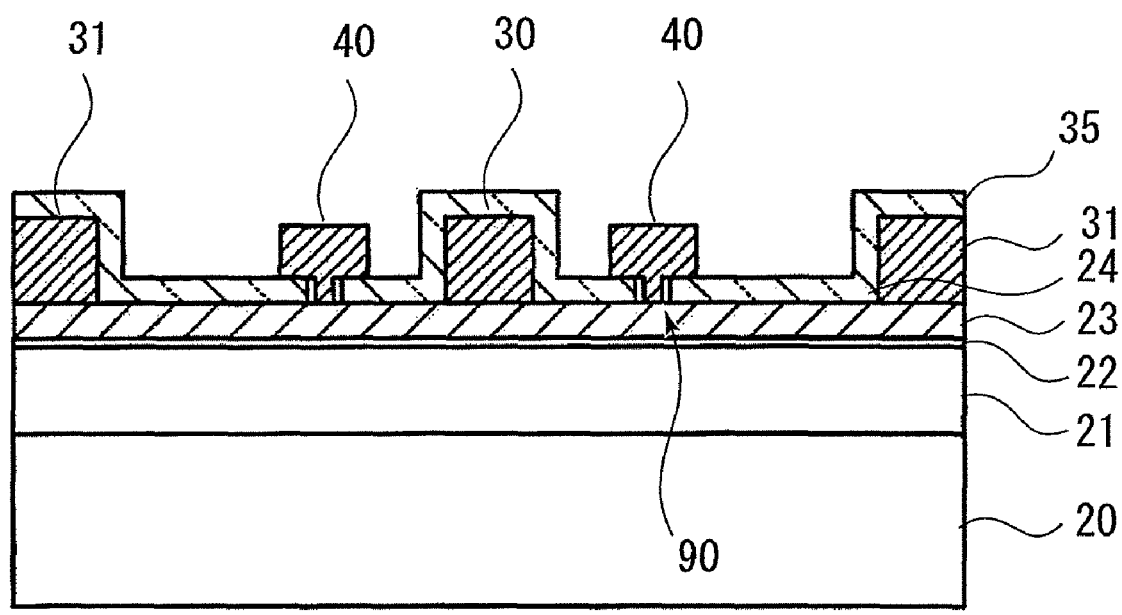
FIG. 7 is a sectional view of a related art semiconductor device.

As shown in FIG. 6C, the protection film 45 is formed on the entire face of the substrate. Furthermore, as shown in FIG. 6D, the interlayer insulation film 46 is formed on the protection film 45.

In the fifth embodiment, as shown in FIG. 6B, the surface of the cap layer 24 in the regions adjacent to the lower end of the gate electrode 40F is covered with the protection film 60 during the heat treatment. Since the protection film 60 covers only the hidden regions of the eave portions of the gate electrode 40F, the effect of the shrinkage of the protection film 60 is reduced. Hence, the occurrence of a clearance at the interface between the protection film 60 and each of the side faces of the lower portion of the gate electrode 40F can be suppressed.

Although the spacer layer 22 is disposed between the carrier transport layer 21 and the carrier supply layer 23 in the above-mentioned first to fifth embodiments, the spacer layer 22 can be omitted. Furthermore, the cap layer 24 disposed on the carrier supply layer 23 can also be omitted. Moreover, it may also be possible that a structure operating as a field-effect transistor is adopted instead of the epitaxially laminated semiconductor structure ranging from the carrier transport layer 21 to the gate electrodes 40F and the source electrodes 30F.

In the above-mentioned first to fifth embodiments, it is expected that a significant effect can be obtained in the case that a nitride semiconductor containing nitrogen as a group-V element is used for the carrier transport layer 21, the carrier supply layer 23, etc. As the material of the substrate on which nitride semiconductor layers are laminated, sapphire, GaAs, Si, etc. may also used in addition to SiC. Furthermore, the substrate may have a semi-insulating property or may have conductivity. Moreover, in the above-mentioned second and third embodiments, although $Al_2O_3$ is used as the insulating material of the MIS gate, the material is not limited to this material, but it may be possible to use other materials, provided that they are inorganic insulating materials.

In addition, although heat treatment is performed after the formation of the electrodes to obtain the ohmic feature between the source electrode 30F and the carrier transport layer 21 and between the drain electrode 31F and the carrier transport layer 21 in the above-mentioned first to fifth embodiments, the ohmic feature may be obtained without performing heat treatment depending on the materials of the electrodes.

Furthermore, although SiN is used for the protection films 35 and 60 in the above-mentioned first to fifth embodiments, other inorganic insulating materials may also be used. In the case that the linear expansion coefficients of the protection films 35 and 60 are larger than that of the substrate 20, the effect of forming the gate side openings is significant.

Although the present invention has been described above with respect to specific embodiments thereof, the present invention is not limited to these embodiments. For example, it will be apparent to those skilled in the art that various modifications, improvements, combinations and the like can be made.

What is claimed is:

1. A semiconductor device comprising:
   a source electrode and a drain electrode formed over a semiconductor substrate;

a gate electrode formed over the semiconductor substrate and disposed between the source electrode and the drain electrode;

a protection film made of an insulating material and formed between the source electrode and the gate electrode and between the drain electrode and the gate electrode; and a gate side opening formed at least in one of a portion of the protection film between the source electrode and the gate electrode and a portion of the protection film between the drain electrode and the gate electrode and disposed away from the gate electrode, the source electrode and the drain electrode.

2. The semiconductor device according to claim 1, further comprising:

a carrier transport layer formed over the semiconductor substrate; and a carrier supply layer formed over the carrier transport layer; wherein the source electrode, the drain electrode and the gate electrode are formed over the carrier supply layer.

3. The semiconductor device according to claim 1, wherein each of the source electrode, the drain electrode, the gate electrode and the gate side opening extend in a first direction.

4. The semiconductor device according to claim 2, further comprising:

an insulation film made of an insulating material different from that of the protection film disposed so as to cover a surface of the protection film and disposed between the gate electrode and the carrier supply layer.

5. The semiconductor device according to claim 4, wherein the insulation film covers a inner face of the gate side opening.

6. The semiconductor device according to claim 1, wherein the protection film covers a surface of the gate electrode.

7. The semiconductor device according to claim 1, wherein an ohmic junction is formed between a carrier supply layer and the drain electrode and another ohmic junction is formed between the carrier supply layer and the source electrode.

8. A semiconductor device comprising:

a source electrode and a drain electrode formed over a semiconductor substrate;

a gate electrode formed over the semiconductor substrate, disposed between the source electrode and the drain electrode and including a base portion and an eave portion formed on the base portion;

a first protection film made of an insulating material and formed below the eave portion of the gate electrode and on side faces of the base portion of the gate electrode; and a second protection film made of the insulating material, covering a surface of the first protection film and formed between the source electrode and the gate electrode and between the drain electrode and the gate electrode.

* * * * *